United States Patent [19]
Brown

[11] 3,940,693
[45] Feb. 24, 1976

[54] PHASE SENSITIVE DETECTOR

[75] Inventor: Neil L. Brown, Falmouth, Mass.

[73] Assignee: The United States of America as represented by the Secretary of the Navy, Washington, D.C.

[22] Filed: Oct. 24, 1974

[21] Appl. No.: 517,699

[52] U.S. Cl............... 324/83 A; 307/232; 307/295; 324/83 FE; 328/134
[51] Int. Cl.² ........................................ H03D 13/00
[58] Field of Search ............ 307/232, 295; 328/133, 328/134, 155; 324/83 R, 83 A, 83 FE

[56] References Cited
UNITED STATES PATENTS
3,659,210   4/1972   Nilsson .............................. 307/232

*Primary Examiner*—John Kominski
*Attorney, Agent, or Firm*—R. S. Sciascia; L. I. Shrago

[57] ABSTRACT

A phase detector which utilizes an amplifier that has the input signal coupled by resistive elements to both its non-inverting and inverting input terminals operates with an amount of negative feedback determined by the magnitude of the resistive element associated with the inverting input terminal. The reference signal controls a switching device which grounds the non-inverting terminal during the time when this signal has a particular polarity. As a consequence, the gain of the amplifier shifts between equal, positive and negative values in synchronism with changes in the polarity of the reference signal, and the average value of the output signal of the amplifier is indicative of the phase relationship between the input and reference signals when these signals have the same frequency.

2 Claims, 2 Drawing Figures

PHASE SENSITIVE DETECTOR

The present invention relates generally to electronic measuring circuits and, more particularly, to a simplified arrangement for providing an indication of the phase angle between a pair of signal voltages.

One of the conventional techniques for determining the phase displacement between a reference voltage and a signal voltage involves simultaneously adding and subtracting equal components of these voltages, rectifying the sum and difference voltages and, thereafter, applying the resulting voltages to an RC network constructed such that its output voltage is a sine function of the phase angle between the voltages being compared. This method of phase detection, which is amplitude sensitive, requires equal amplitude, reference and input signal voltages to satisfy the trignometric identity for the sum and difference of these voltages.

It is, accordingly, a primary object of the present invention to provide a simplified phase sensitive detector which does not require equal amplitude signal voltages.

Another object of the present invention is to provide a synchronous phase sensitive detector of simple construction.

Another object of the present invention is to provide a relatively simple phase sensitive detector which can reliably detect signals as small as several millivolts.

Other objects, advantages and novel features of the invention will become apparent from the following detailed description of the invention when considered in conjunction with the accompanying drawings wherein.

Briefly, the above objects of invention are achieved by selectively controlling an amplifier which has a negative feedback provision such that its gain shifts between equal, positive and negative values in synchronism with phase reversals in one of the signal voltages. The other signal involved in the phase comparison operation which has the same frequency is applied simultaneously to a pair of inverting and non-inverting input terminals of this amplifier. The amplifier's output signal, consequently, is a negative full wave rectification of the input signal when this signal and the other, the reference signal, are in phase. When these same signals are 180° out of phase, this output signal is a positive full wave rectification of the input signal. With a 90° phase relationship, this signal has symmetrical positive and negative portions and, thus, exhibits a zero average value. Thus, the average value of the output signal is indicative of the true phase relationship between the two signals being compared.

Figure 1:
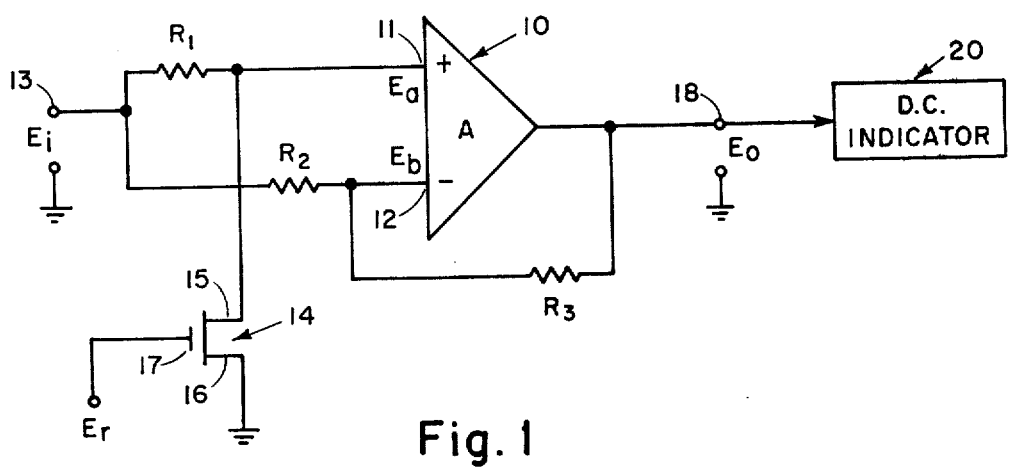
FIG. 1 shows the phase sensitive detecting circuit.

Referring now to FIG. 1, it will be seen that the phase sensitive detector of the present invention includes an operational amplifier 10 having a non-inverting input terminal 11 and an inverting input terminal 12. One of the signals involved in the phase comparison operation, which may be designated the input signal voltage, $E_i$, and which is available at terminal 13, is coupled to terminal 11 by resistor $R_1$ and to terminal 12 by resistor $R_2$. A third resistor $R_3$, which has the same magnitude as resistor $R_2$, is connected betweeen the output of amplifier 10 and terminal 12 to provide a negative feedback feature. The value of $R_1$ is not critical, but $R_2$ must be equal to $R_3$. Normally, $R_1$, $R_2$ and $R_3$ would have the same value.

The other element in the circuit of FIG. 1 is an FET device 14, which performs a switching operation and has its source electrode connected to terminal 11 of amplifier 10 and its drain electrode 16 grounded. The other signal involved in the phase comparison operation, reference voltage $E_r$, which has the same frequency of $E_i$, is connected to the gate electrode 17 of the FET and, consequently, functions to turn this FET "off" and "on".

Figure 2:
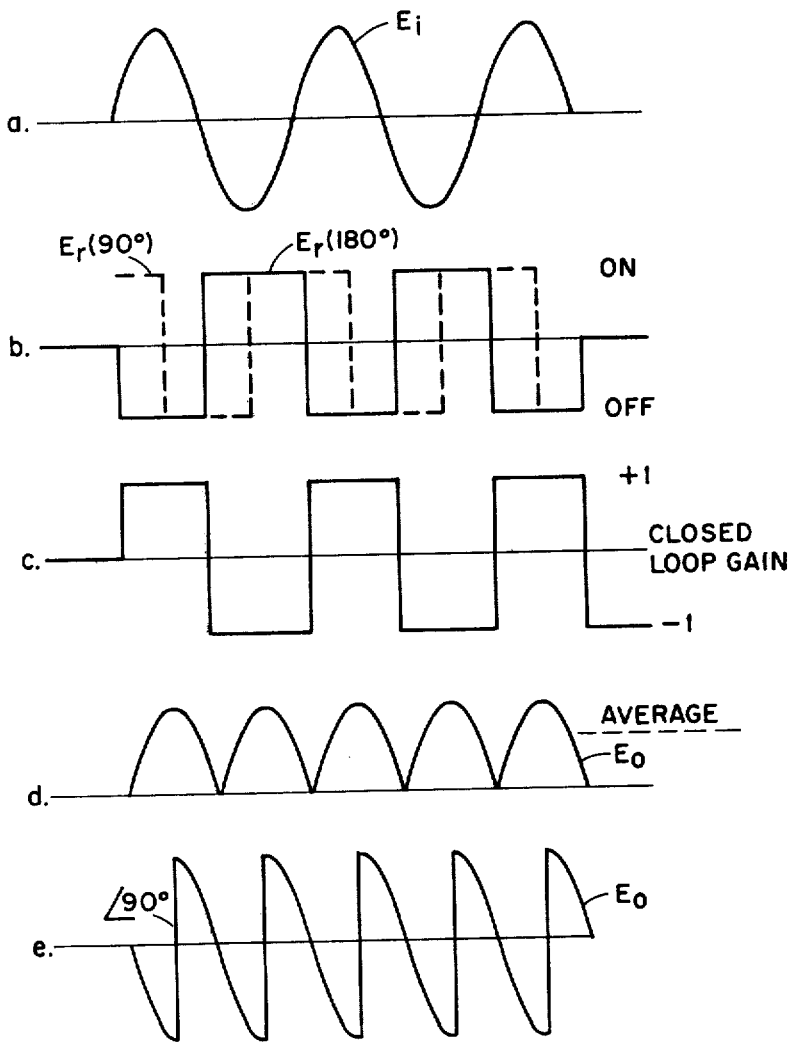
FIG. 2 is a series of waveforms helpful in understanding the mode of operation of the circuit of FIG. 1.

The operation in the circuit of FIG. 1 may, perhaps, best be understood by considering the sequence of waveforms shown in FIG. 2. The input signal, $E_i$, is displayed in line $a$ of this Fig. and corresponds to a sinusoidal waveform of constant amplitude. The reference signal, $E_r$, is shown in line $b$, and it will be seen that this signal is a square wave having the same frequency as the input signal $E_i$ but here 180° out of phase therewith. When this reference signal is positive, it will be appreciated, FET 14 is turned on; when it is negative, this device is turned off.

If, when the FET device is turned on this on resistance is negligibly small compared with $R_1$, then when terminal 11 thus grounded, the gain of the circuit is negative and will be equal to $R_3/R_2$. However, since $R_2$ equals $R_3$, this gain is $-1$.

When the FET 14 is turned off, terminal 11 is isolated from ground. The gain of the circuit at this time is $+1$, and this may be seen from the following analysis: If one starts with the usual assumptions that amplifier 10 has an infinite input impedance and an infinite open loop gain, it may be stated that:

$$E_a = E_i \tag{1}$$

$$E_b = E_i \left(\frac{R_3}{R_2 + R_3}\right) + E_o \left(\frac{R_2}{R_2 + R_3}\right) \tag{2}$$

$$E_o = (E_a - E_b\ A_o) \tag{3}$$

Therefore $$E_o = A_o \left[ E_i \left(1 - \frac{R_3}{R_2 + R_3}\right) - E_o \left(\frac{R_2}{R_2 + R_3}\right) \right]$$

or $$E_o = \left[1 + A_o \left(\frac{R_2}{R_2 + R_3}\right)\right] = A_o E_i \left(1 - \frac{R_3}{R_2 + R_3}\right)$$

$$\frac{E_o}{E_i} = \frac{1 - \frac{R_3}{R_2 + R_3}}{\frac{1}{A_o} + \frac{R_3}{R_2 + R_3}}$$

Since $A_o$ is a relatively large figure, the term $1/A_o$ may be ignored.

Thus $$\frac{E_o}{E_i} = \frac{(R_2 + R_3) - R_3}{R_2}$$

$$= +1$$

The gain of the circuit is shown in line $c$ of FIG. 2, and it will be seen that this gain shifts between $+1$ and $-1$ in synchronism with phase changes in the reference voltage.

The output signal of the detector, $E_o$, present at terminal 18 is shown in line $d$ of FIG. 2, and it will be seen that this waveform corresponds to a positive full wave rectification of the input signal $E_i$ of line $a$. Thus, when the input and reference signals are 180° out of phase, this output signal will have its greatest positive average value at indicator 20. When $E_i$ and $E_r$ are in phase, the output waveform, it will be appreciated, changes to a negative full wave rectification of the input signal. This condition produces an equivalent negative signal whose magnitude equals that developed by the circuit in the out-of-phase case. Likewise, when $E_i$ and $E_r$ have a 90° phase relationship, as suggested by the dotted lines in line $b$, the output signal has the waveform shown in line $e$ which consists of symmetrical positive and negative portions. The shift between these portions, as noted hereinbefore, occurs in synchronism with the phase reversals in $E_r$. The average value of $E_o$ with such a quadrature phase relationship is zero.

As the above analysis demonstrates, the average value of $E_o$ is, therefore, indicative of the phase relationship between the two signals $E_i$ and $E_r$ involved in the phase comparison operation. A DC meter which responds to the average value of the input signal can be used in the circuit of FIG. 1 to provide an indication of this phase angle.

In the circuit of FIG. 1, FET 14 serves, as noted hereinbefore, simply as a switching device to periodically connect the non-inverting terminal 11 of amplifier 10 to ground. In order to achieve this switching with a minimum delay, the reference signal voltage which is applied to the gate of the FET is selected to have a square waveform. However, it should be understood that if the signal available has, for example, a sinusoidal waveform, a suitable wave shaping circuit may be included in the system to obtain the preferred square wave voltage. Also, the FET device may be replaced by any other solid-state device or component available in the art which can duplicate the switching action under the control of a suitable input signal.

It would also be mentioned that the circuit of FIG. 1 may include a suitable filter in the output circuit of the amplifier to provide a more suitable waveform for either a subsequent measurement operation or where the output signal serves as an error signal in an automatic close loop control system.

What is claimed is:

1. A phase sensitive detector comprising, in combination an amplifier having a non-inverting input terminal, an inverting input terminal and an output circuit;

a first resistor having one side thereof connected to said non-inverting terminal;

a second resistor having one side thereof connected to said inverting terminal;

a third resistor connected between said output circuit and said inverting terminal to provide negative feedback for said amplifier, said second and third resistors having equal values;

means for connecting a first signal to both other ends of said first and second resistors; and means for grounding said non-inverting terminal whenever a second signal has a particular polarity whereby the signal appearing in the output circuit of said amplifier has an average value which is indicative of the phase between said first and second signals.

2. In an arrangement as defined in claim 1 wherein said means for grounding said non-inverting terminal comprises an FET device with its channel electrode connected to said non-inverting terminal, its drain electrode grounded and said second signal being connected to its gate electrode.

* * * * *